(12) United States Patent
Sasaki

(10) Patent No.: US 7,636,017 B2
(45) Date of Patent: Dec. 22, 2009

(54) HIGH-FREQUENCY POWER AMPLIFIER

(75) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/190,611

(22) Filed: Aug. 13, 2008

(65) Prior Publication Data

US 2009/0096529 A1   Apr. 16, 2009

(30) Foreign Application Priority Data

Oct. 11, 2007   (JP)   ............................. 2007-265208

(51) Int. Cl.
*H03F 3/68* (2006.01)

(52) U.S. Cl. .................. 330/295; 330/124 R; 330/149; 330/54

(58) Field of Classification Search ................. 330/295, 330/124 R, 149, 54
See application file for complete search history.

(56) References Cited

U.S. PATENT DOCUMENTS

| 4,845,440 | A | * | 7/1989 | Aitchison | .................... 330/277 |
| 5,208,547 | A | * | 5/1993 | Schindler | ..................... 330/54 |
| 5,469,108 | A | | 11/1995 | Tserng | |
| 5,519,358 | A | | 5/1996 | Tserng | |
| 6,008,694 | A | * | 12/1999 | El-Sharawy | .................. 330/54 |
| 6,342,815 | B1 | * | 1/2002 | Kobayashi | .................. 330/286 |
| 6,369,655 | B2 | | 4/2002 | Nishida et al. | |
| 6,396,348 | B1 | | 5/2002 | Honjo | |
| 6,737,921 | B2 | * | 5/2004 | Nakano | ..................... 330/286 |

FOREIGN PATENT DOCUMENTS

| EP | 0 704 965 A1 | 4/1996 |
| JP | 08-078976 A | 3/1996 |
| JP | 9-266421 A | 10/1997 |
| JP | 11-220343 A | 8/1999 |
| JP | 2001-111362 A | 4/2001 |
| JP | 2001-203542 A | 7/2001 |

* cited by examiner

*Primary Examiner*—Patricia Nguyen
(74) *Attorney, Agent, or Firm*—Leydig, Voit & Mayer, Ltd.

(57) ABSTRACT

Amplification transistors respectively amplify an input signal. The output terminals of the amplification transistors are connected in series through respective transmission lines. A harmonic processing circuit is connected to an end of the array of collectors (output terminals) of the amplification transistors. The harmonic processing circuit suppresses harmonics included in output voltages of the amplification transistors. A transmission line and an MIM capacitor form a shorting circuit which establishes a short-circuit for the harmonics between the collector of the amplification transistor nearest to the harmonic processing circuit and the collector of the amplification transistor farthest from the harmonic processing circuit.

2 Claims, 4 Drawing Sheets

HIGH-FREQUENCY POWER AMPLIFIER

BACKGROUND OF THE INVENTION

1. Field of the Invention

The present invention relates to a high-frequency power amplifier provided with a harmonic processing circuit to suppress harmonics included in output voltages of amplification transistors, and more particularly, to a high-frequency power amplifier capable of producing effects of the harmonic processing circuit on the respective amplification transistors more uniformly.

2. Background Art

There is a proposal of a high-frequency power amplifier operating with a high-frequency band of several tens of MHz or more provided with a harmonic processing circuit to suppress harmonics included in output voltages of amplification transistors to improve its distortion characteristic (e.g., see. Japanese Patent Laid-Open No. 2001-111362).

FIG. 6 is a diagram showing a layout pattern of a conventional high-frequency power amplifier. An input signal inputted to an input port Port1 is supplied to amplification transistors $Q_1$ to $Q_{10}$ through a transmission line TB. The amplification transistors $Q_1$ to $Q_{10}$ amplify the input signal respectively and output it to an output port Port2 through a transmission line TC. A harmonic processing circuit STUB is connected to a connection point between the amplification transistors $Q_1$ to $Q_{10}$ and the output port Port2. The harmonic processing circuit STUB is an open stub having a ¼ wavelength for a frequency, for example, double the input frequency and suppresses a double wave (harmonic) included in the output voltages of the amplification transistors $Q_1$ to $Q_{10}$.

FIG. 7 is an enlarged view of the encircled area of FIG. 6. The base of the amplification transistor $Q_7$ and the transmission line TB are connected together, the collector and the transmission line TC are connected together and the emitter and GND are connected together through an air bridge AB.

FIG. 8 is a diagram showing an equivalent circuit of the conventional high-frequency power amplifier. The bases of the amplification transistors $Q_1$ to $Q_{10}$ are connected to the input port Port1 through the transmission lines TB1 to TB10. Furthermore, the collectors of the amplification transistors $Q_1$ to $Q_5$ are connected in series through the transmission lines TC1 to TC4 respectively and the collectors of the amplification transistors $Q_6$ to $Q_{10}$ are connected in series through the transmission lines TC6 to TC9.

The collector of the amplification transistor $Q_5$ is connected to the output port Port2 through the transmission line TC5 and the collector of the amplification transistor $Q_{10}$ is connected to the output port Port2 through the transmission line TC10. The harmonic processing circuit STUB is connected to the output port Port2. Therefore, the harmonic processing circuit STUB is connected to one end of the line of the collectors of the amplification transistors $Q_1$ to $Q_5$ and one end of the line of the collectors of the amplification transistors $Q_6$ to $Q_{10}$.

FIG. 9 is a diagram showing a time waveform of the collector current of the amplification transistor. When a large signal is inputted, it is clipped by a static characteristic of the amplification transistor and distortion occurs in the collector current. In this case, a fundamental and harmonics having frequencies double, triple and quadruple the frequency of the fundamental are included.

FIG. 10 is a diagram showing a time waveform of the output voltage of the amplification transistor. Suppose the same load as that of the fundamental is also connected to harmonics. When there is no harmonic processing circuit, the waveform of the output voltage is analogous to the waveform of the collector current. On the other hand, when a harmonic processing circuit is added, the harmonics included in the output voltage are suppressed, and therefore it is possible to obtain a large waveform for the fundamental.

SUMMARY OF THE INVENTION

The conventional configuration has a variation in an electric distance between the respective amplification transistors and the harmonic processing circuit, and thus there is a problem that the effects of the harmonic processing circuit cannot be produced uniformly on the respective amplification transistors. For this reason, it has not been possible to obtain a waveform sufficiently large for the fundamental.

The present invention has been implemented to solve the above described problems and it is an object of the present invention to obtain a high-frequency power amplifier capable of producing effects of a harmonic processing circuit on respective amplification transistors more uniformly.

According to one aspect of the present invention, a high-frequency power amplifier comprises: a plurality of amplification transistors which amplify an input signal respectively and respective output terminals of which are connected in series through a transmission line; a harmonic processing circuit connected to one end of an array of output terminals of the plurality of amplification transistors to suppress harmonics included in output voltages of the plurality of amplification transistors; and short circuits which make short-circuits between the output terminal of the amplification transistor nearest to the harmonic processing circuit and the output terminal of the amplification transistor farthest from the harmonic processing circuit for the harmonics.

The present invention allows the effects of the harmonic processing circuit on the respective amplification transistors to be produced more uniformly.

Other and further objects, features and advantages of the invention will appear more fully from the following description.

DETAILED DESCRIPTION OF THE PREFERRED EMBODIMENTS

Embodiment 1

Figure 1:
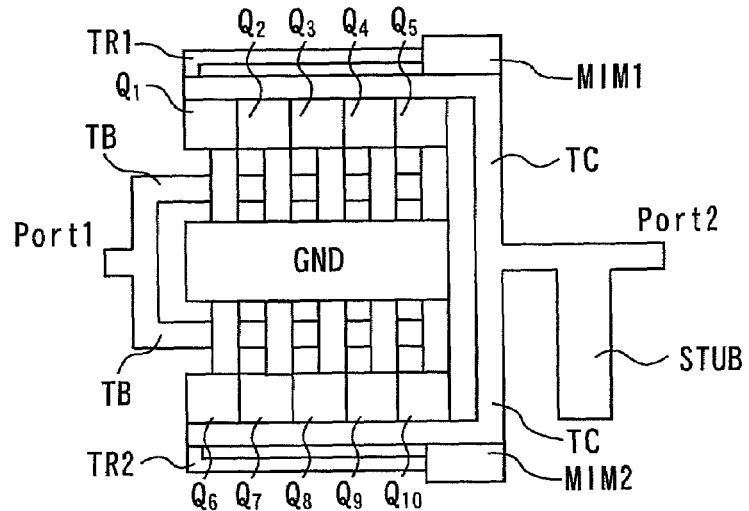
FIG. 1 is a diagram showing a layout pattern of a high-frequency power amplifier according to Embodiment 1 of the present invention.

FIG. 1 is a diagram showing a layout pattern of a high-frequency power amplifier according to Embodiment 1 of the present invention. An input signal inputted to an input port Port1 is supplied to amplification transistors $Q_1$ to $Q_{10}$ through a transmission line TB. The amplification transistors $Q_1$ to $Q_{10}$ amplify the input signal respectively and output it to an output port Port2 through a transmission line TC. A harmonic processing circuit STUB is connected to a connection point between the amplification transistors $Q_1$ to $Q_{10}$ and the output port Port2. The harmonic processing circuit STUB is an open stub having, for example, a ¼ wavelength with respect to a frequency double the input frequency and suppresses a double wave (harmonic) included in the output voltages of the amplification transistors $Q_1$ to $Q_{10}$.

In this embodiment, the collectors of the amplification transistors $Q_1$, $Q_5$ at both ends of the transistor array are connected to a transmission line TR1 through an MIM capacitor MIM1. Furthermore, the collectors of the amplification transistors $Q_6$, $Q_{10}$ at both ends of the transistor array are connected to a transmission line TR2 through an MIM capacitor MIM2.

Figure 2:
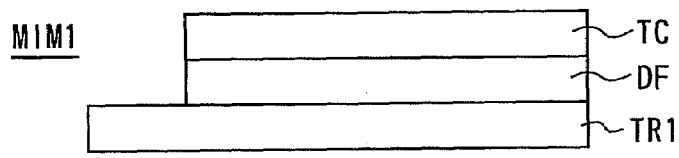
FIG. 2 is a cross-sectional view showing the MIM capacitor.

FIG. 2 is a cross-sectional view showing the MIM capacitor. The MIM capacitor MIM1 is constituted of the transmission line TR1, the transmission line TC and a dielectric film DF interposed therebetween.

Figure 3:
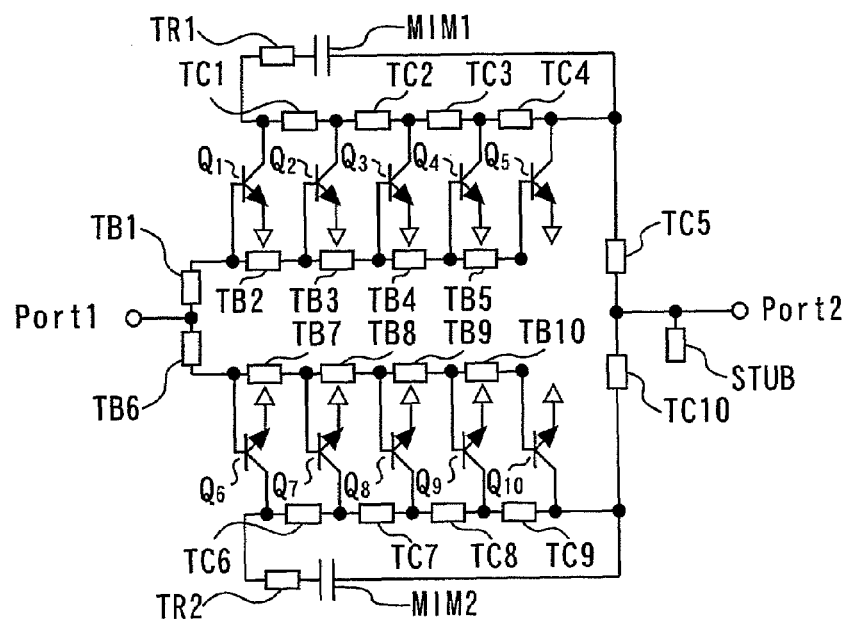
FIG. 3 is a diagram showing an equivalent circuit of the high-frequency power amplifier according to Embodiment 1 of the present invention.

FIG. 3 is a diagram showing an equivalent circuit of the high-frequency power amplifier according to Embodiment 1 of the present invention. The bases of the amplification transistors $Q_1$ to $Q_{10}$ are connected to the input port Port1 through the transmission lines TB1 to TB10. Furthermore, the collectors (output terminals) of the amplification transistors $Q_1$ to $Q_5$ are connected in series through the respective transmission lines TC1 to TC4 and the collectors of the amplification transistors $Q_6$ to $Q_{10}$ are connected in series through the transmission lines TC6 to TC9.

The collector of the amplification transistor $Q_5$ is connected to the output port Port2 through the transmission line TC5 and the collector of the amplification transistor $Q_{10}$ is connected to the output port Port2 through the transmission line TC10. The harmonic processing circuit STUB is connected to the output port Port2. Therefore, the harmonic processing circuit STUB is connected to one end of the collector array of the amplification transistors $Q_1$ to $Q_5$ and one end of the collector array of the amplification transistors $Q_6$ to $Q_{10}$.

Parameters such as characteristic impedance and physical length of the transmission lines TR1, TR2 and capacitance values of the MIM capacitors MIM1, MIM2 are set so as to produce resonance at a frequency of double wave. Therefore, the transmission line TR1 and MIM capacitor MIM1 form a short circuit that makes a short-circuit between the collector of the amplification transistor $Q_5$ nearest to the harmonic processing circuit STUB and the collector of the amplification transistor $Q_1$ farthest from the harmonic processing circuit STUB for a double wave (harmonic). Likewise, the transmission line TR2 and MIM capacitor MIM2 form a short circuit that makes a short-circuit between the collector of the amplification transistor $Q_{10}$ nearest to the harmonic processing circuit STUB and the collector of the amplification transistor $Q_6$ farthest from the harmonic processing circuit STUB for a double wave (harmonic).

This allows the same effect of the harmonic processing circuit STUB to be produced on the amplification transistors $Q_1$, $Q_6$ farthest from the harmonic processing circuit STUB as well as the amplification transistor $Q_5$, $Q_{10}$ nearest to the harmonic processing circuit STUB. Furthermore, the electric lengths of the intermediate amplification transistors $Q_2$ to $Q_4$, $Q_7$ to $Q_9$ from the harmonic processing circuit STUB are also made shorter, and therefore the effects of the harmonic processing circuit STUB on these amplification transistors can also be produced effectively. Therefore, the effects of the harmonic processing circuit STUB on the amplification transistors $Q_1$ to $Q_{10}$ can be produced more uniformly and it is possible to obtain a sufficiently large waveform for the fundamental.

In the above described embodiment, the short circuit is short-circuited for a double wave but may also be set so as to be short-circuited for other harmonics. Furthermore, the short circuit in the above described embodiment makes a short-circuit between the collectors of the amplification transistors at both ends of the transistor array, but it is also possible to make a short-circuit between the collectors of the intermediate amplification transistors.

Embodiment 2

Figure 4:
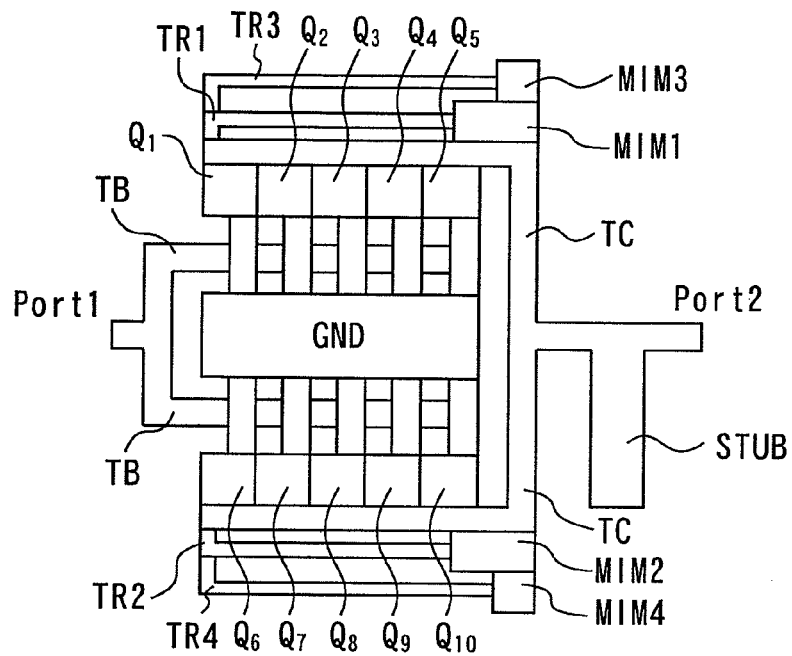
FIG. 4 is a diagram showing a layout pattern of a high-frequency power amplifier according to Embodiment 2 of the present invention.
Figure 5:
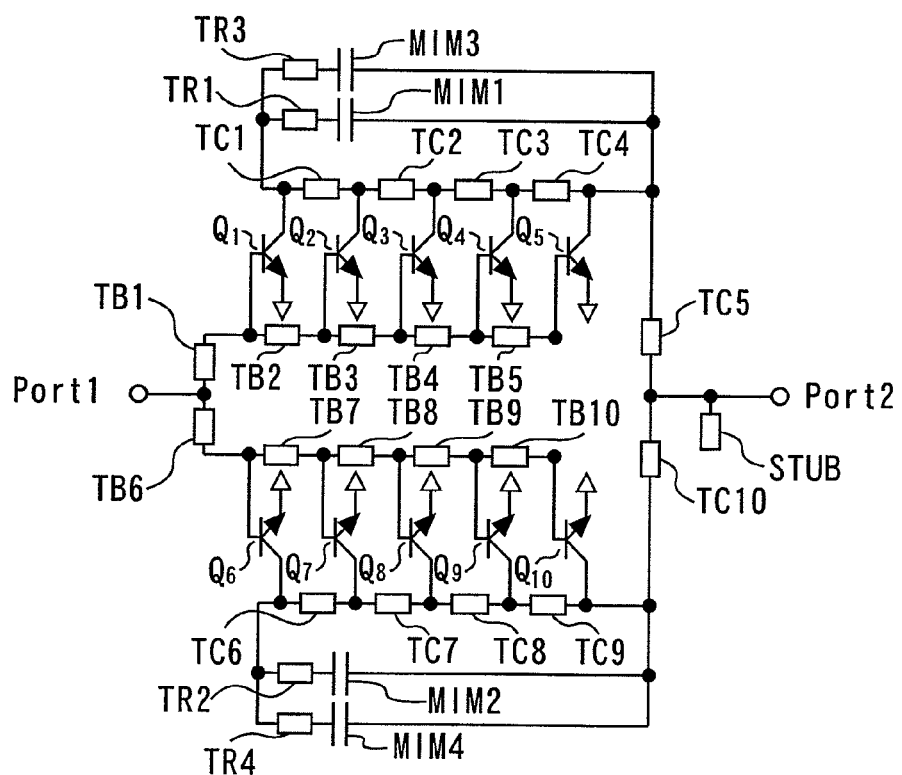
FIG. 5 is a diagram showing an equivalent circuit thereof.
Figure 6:
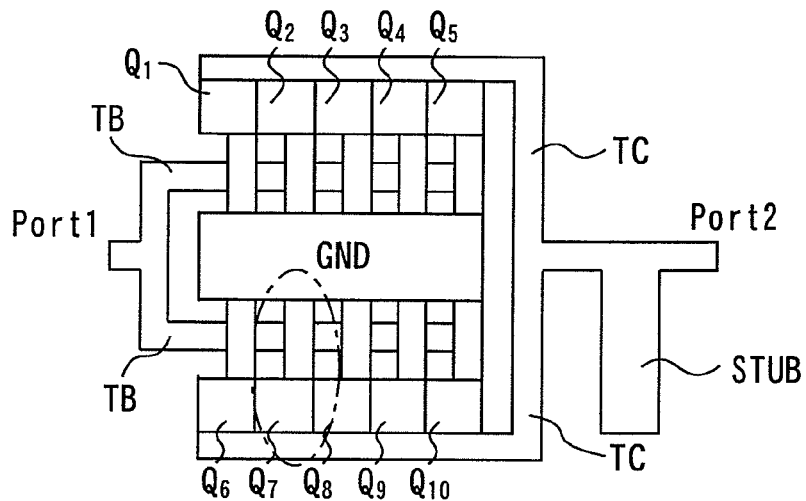
FIG. 6 is a diagram showing a layout pattern of a conventional high-frequency power amplifier.
Figure 7:
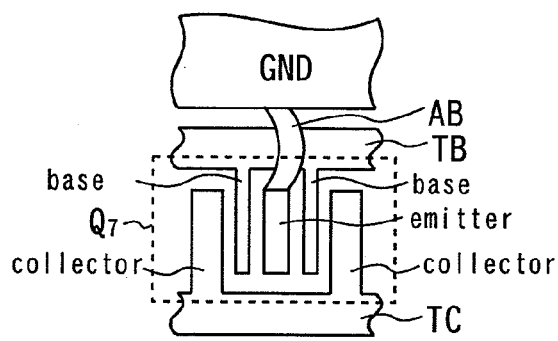
FIG. 7 is an enlarged view of the encircled area of FIG. 6.
Figure 8:
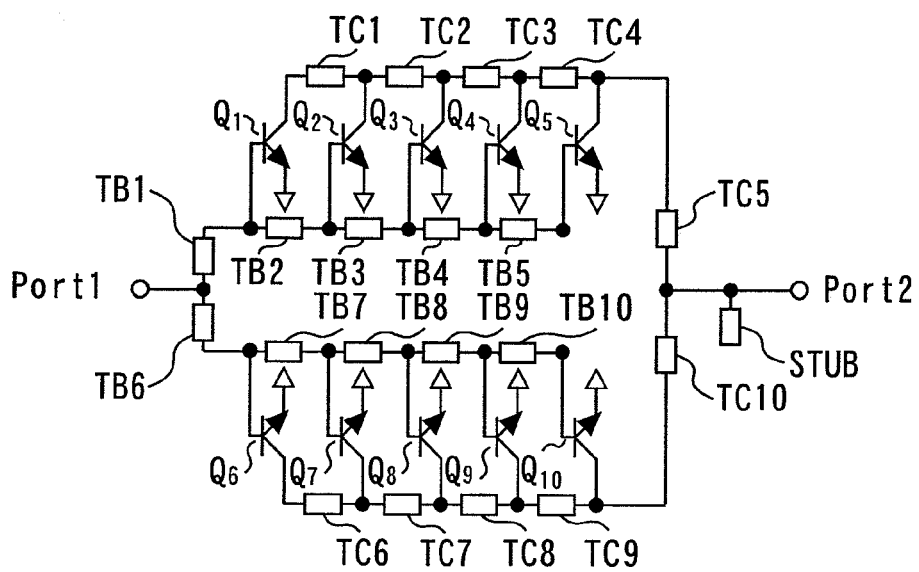
FIG. 8 is a diagram showing an equivalent circuit of the conventional high-frequency power amplifier.
Figure 9:
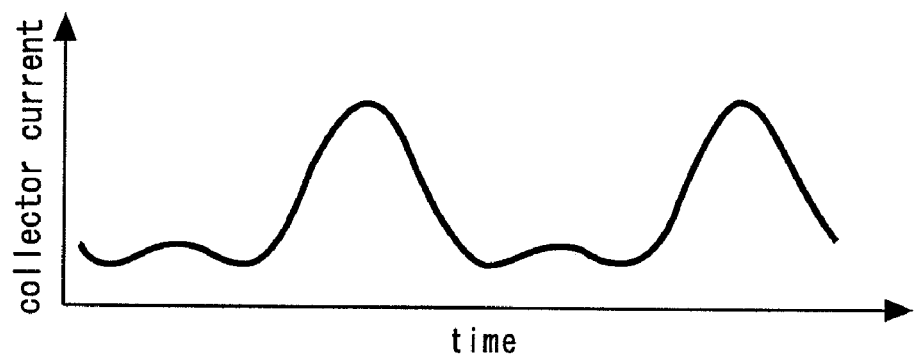
FIG. 9 is a diagram showing a time waveform of the collector current of the amplification transistor.
Figure 10:
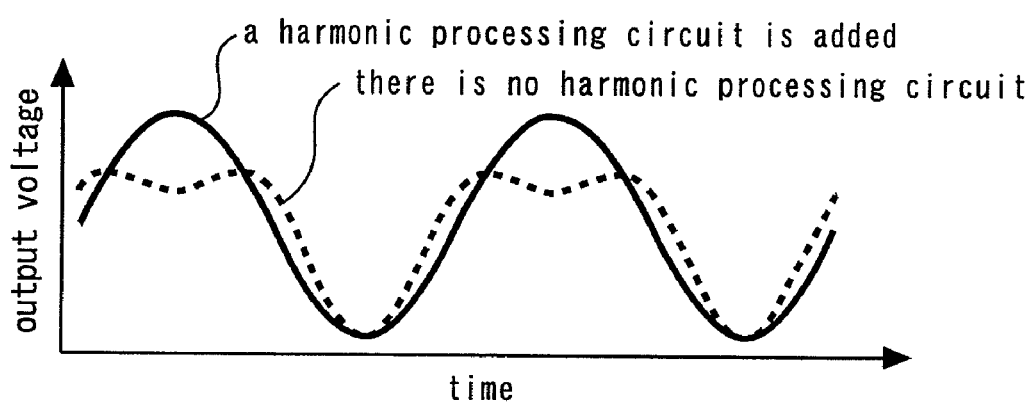
FIG. 10 is a diagram showing a time waveform of the output voltage of the amplification transistor.

FIG. 4 is a diagram showing a layout pattern of a high-frequency power amplifier according to Embodiment 2 of the present invention and FIG. 5 is a diagram showing an equivalent circuit thereof. The same components as those in Embodiment 1 are assigned the same reference numerals and explanations thereof will be omitted.

This embodiment further provides a transmission line TR3 and an MIM capacitor MIM3 which connect the collectors of amplification transistors $Q_1$, $Q_5$ at both ends of a transistor array and a transmission line TR4 and an MIM capacitor MIM4 which connect the collectors of amplification transistors $Q_6$, $Q_{10}$ at both ends of a transistor array.

Characteristic impedance of the transmission lines TR3, TR4 and capacitance values of the MIM capacitors MIM3, MIM4 are set so as to produce resonance at a frequency of triple wave. Therefore, the transmission line TR3 and MIM capacitor MIM3 form a short circuit that makes a short-circuit between the collector of the amplification transistor $Q_5$ nearest to the harmonic processing circuit STUB and the collector of the amplification transistor $Q_1$ farthest from the harmonic processing circuit STUB for a triple wave (harmonic). Likewise, the transmission line TR4 and MIM capacitor MIM4 form a short circuit that makes a short-circuit between the collector of the amplification transistor $Q_{10}$ nearest to the harmonic processing circuit STUB and the collector of the amplification transistor $Q_6$ farthest from the harmonic processing circuit STUB for a triple wave (harmonic).

In this way, for a plurality of harmonics having different frequencies, this embodiment provides short circuits which make short-circuits between the collectors of the amplification transistors $Q_5$, $Q_{10}$ nearest to the harmonic processing circuit STUB and the collectors of the amplification transistors $Q_1$, $Q_6$ farthest from the harmonic processing circuit STUB. Therefore, it is possible to produce effects of the harmonic processing circuit STUB on the respective amplification transistors $Q_1$ to $Q_{10}$ more uniformly for a plurality of harmonics having different frequencies.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-265208, filed on Oct. 11, 2007 including specification, claims, drawings and summary, on which the Convention priority of the present application is based, are incorporated herein by reference in its entirety.

What is claimed is:

1. A high-frequency power amplifier comprising:
 a plurality of amplification transistors which amplify an input signal, respectively, and have respective output terminals connected in series through a transmission line;
 a harmonic processing circuit connected to an end of an array of output terminals of the plurality of amplification transistors to suppress harmonics included in output voltages of the plurality of amplification transistors; and
 shorting circuits which establish short-circuits for the harmonics between the output terminal of the amplification transistor nearest to the harmonic processing circuit and the output terminal of the amplification transistor farthest from the harmonic processing circuit.

2. The high-frequency power amplifier according to claim 1, wherein the shorting circuits establish short-circuits, for a plurality of harmonics having different frequencies, between the output terminal of the amplification transistor nearest to the harmonic processing circuit and the output terminal of the amplification transistor farthest from the harmonic processing circuit.

* * * * *